US008787062B2

(12) United States Patent
Annunziata et al.

(10) Patent No.: US 8,787,062 B2
(45) Date of Patent: Jul. 22, 2014

(54) PINNING MAGNETIC DOMAIN WALLS IN A MAGNETIC DOMAIN SHIFT REGISTER MEMORY DEVICE

(75) Inventors: Anthony J. Annunziata, Stamford, CT (US); Michael C. Gaidis, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/539,544

(22) Filed: Jul. 2, 2012

(65) Prior Publication Data
US 2014/0003117 A1    Jan. 2, 2014

(51) Int. Cl.
G11C 19/00    (2006.01)

(52) U.S. Cl.
USPC ......................................................... 365/80

(58) Field of Classification Search
USPC ......................................................... 365/80
See application file for complete search history.

(56) References Cited

U.S. PATENT DOCUMENTS

| | | | |
|---|---|---|---|
| 3,670,313 A | 6/1972 | Beausoleil et al. | |
| 4,156,937 A | 5/1979 | Bonnie | |
| 4,664,941 A | 5/1987 | Washburn | |
| 6,834,005 B1 | 12/2004 | Parkin | |
| 6,970,379 B2 | 11/2005 | Parkin | |
| 7,539,051 B2 * | 5/2009 | Deligianni et al. | 365/173 |
| 7,626,844 B1 | 12/2009 | Moriya et al. | |
| 7,667,994 B1 * | 2/2010 | Moriya et al. | 365/81 |
| 7,710,770 B2 * | 5/2010 | Cowburn et al. | 365/173 |
| 7,768,809 B2 | 8/2010 | Trouilloud | |
| 7,876,595 B2 | 1/2011 | Xi et al. | |
| 8,416,611 B2 * | 4/2013 | Fukami et al. | 365/158 |
| 2008/0278998 A1 * | 11/2008 | Cowburn et al. | 365/171 |
| 2009/0103347 A1 * | 4/2009 | Parkin et al. | 365/80 |
| 2009/0310241 A1 * | 12/2009 | Lee | 360/55 |
| 2009/0316462 A1 | 12/2009 | Xi et al. | |
| 2010/0046268 A1 | 2/2010 | Moriya et al. | |
| 2010/0073984 A1 | 3/2010 | Xi et al. | |
| 2010/0085793 A1 * | 4/2010 | Trouilloud | 365/80 |
| 2012/0126807 A1 * | 5/2012 | Beach et al. | 324/252 |
| 2013/0242647 A1 * | 9/2013 | Nakamura et al. | 365/158 |
| 2014/0003119 A1 * | 1/2014 | Annunziata et al. | 365/80 |

OTHER PUBLICATIONS

B. Bergman et al., "Generation of local magnetic fields at megahertz rates for the study of domain wall propagation in magnetic nanowires," Appl. Phys. Lett., vol. 95, 2009, 262503, 3 pages.
S. Parkin et al., "Magnetic Domain-Wall Racetrack Memory," Science, vol. 320, No. 5873, Apr. 11, 2008, pp. 190-194.

* cited by examiner

*Primary Examiner* — Hoai V Ho
*Assistant Examiner* — Pablo Huerta
(74) *Attorney, Agent, or Firm* — Cantor Colburn LLP; Vazken Alexanian

(57) ABSTRACT

A magnetic domain wall shift register memory device includes a nanowire, a plurality of pinning sites disposed along the nanowire and a control line arranged substantially parallel to the nanowire and configured to support a current.

16 Claims, 5 Drawing Sheets

PINNING MAGNETIC DOMAIN WALLS IN A MAGNETIC DOMAIN SHIFT REGISTER MEMORY DEVICE

BACKGROUND

The present invention relates to magnetic domain wall shift registers, and more specifically, to systems and methods for pinning magnetic domain walls in a magnetic domain wall shift register memory device.

In a magnetic domain wall shift register memory device, domain walls are shifted along a nanowire by applying a time-dependent shift current. This shifting operation is necessary in order to read out the magnetization direction of the domains of the magnetic nanowire that are separated by domain walls. For this type of device, domain walls must be fixed in place when not shifting, but move coherently with all domain walls moving in concert when shifting. This is greatly aided by having specific pinning sites where the domain walls automatically settle and remain after the shift current is applied. A variety of suggestions for implementing such pinning sites have been made, but many (e.g., using geometric constrictions of the nanowire), result in pinning that is too strong, necessitating a large shift current magnitude. Furthermore, pinning that uses geometric constrictions as well as several other proposed methods (e.g., that utilize magnetic structures external to the nanowire), have a pinning strength that is constant in time, referred to here as "static pinning." Static pinning introduces a very significant design tradeoff between pinning that is too strong, necessitating a large shift current, and pinning that is too weak, which may lead to higher bit error rates.

SUMMARY

Exemplary embodiments include a magnetic domain wall shift register memory device, including a nanowire, a plurality of pinning sites disposed along the nanowire, a control line arranged substantially parallel to the nanowire and configured to support a current, and a plurality of magnetized pinning structures disposed along the control line.

Additional exemplary embodiments include a magnetic domain wall shift register memory device, including a nanowire, a plurality of pinning sites disposed along the nanowire, a plurality of control wire loops disposed substantially parallel to the nanowire and configured to support a current, and a plurality of magnetized pinning structures disposed proximate to respective control wire loops of the plurality of control wire loops.

Further exemplary embodiments include a magnetic domain wall shift register memory device, including a nanowire, a plurality of pinning sites disposed along the nanowire and a control line arranged substantially parallel to the nanowire.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

In exemplary embodiments, the systems and methods described herein pin magnetic domain walls in a magnetic domain wall shift register memory device in a manner that allows the domain wall pinning strength to be dynamically controlled. Dynamically-controlled pinning allows a reduced shift-current magnitude to be used, while maintaining strong static pinning between shift operations. As described herein, domain walls should reside at known, regular intervals along the track, so there should be some local pinning mechanism holding them at the interval. Strong static pinning of domain walls necessitates a large shift current, which causes self-heating and requires large drive transistors. Many current techniques of inducing local pinning using fixed/static structures have resulted in pinning that is too strong. In exemplary embodiments, dynamic pinning can solve this problem by reducing pinning strength when shifting, while increasing pinning strength when reading. In exemplary embodiments, the systems and methods described herein implement strong static pinning in the store, write, and read states, and weak pinning when shifting. The pinning strength is controlled by an electrical signal synchronous with the shift current pulse.

Figure 1:
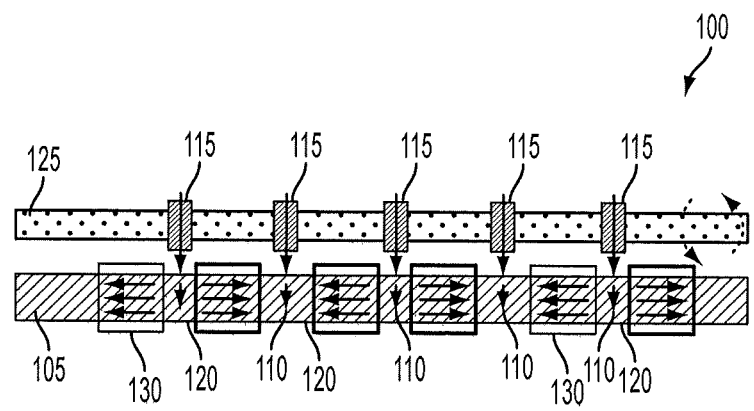
FIG. 1 illustrates a schematic diagram of an exemplary magnetic domain wall shift register memory device.

FIG. 1 illustrates a schematic diagram of an exemplary magnetic domain wall shift register memory device 100. In exemplary embodiments, the device 100 includes a nanowire 105 that supports distinct domain walls 110, which are shifted along the nanowire 105 as described herein, and which separate magnetic domains 130. As described further herein, the device 100 supports both domain wall injection into the nanowire 105 and magnetization readout of the domain walls 110 or the domains 130 from the nanowire 105. The device 100 further includes a series of magnetized structures 115 (e.g., permanent magnets) arranged adjacent respective shift registers 120 disposed in the nanowire 105. The magnetized structures 115 have magnetic fields that induce pinning sites in the nearby magnetic shift registers 120. The magnetized structures 115 are arranged in a control line 125 that is disposed underneath, overhead or alongside the magnetized structures 115 and parallel to the nanowire 105. The control line 125 may be a single or multiple independent or connected current-carrying lines or loops or other structures or any combination thereof. In addition, single or multiple independent or connected control lines may be oriented parallel to and/or perpendicular to and/or in any combination thereof with respect to the nanowire 105. As described further herein, the control line 125 supports current that can be adjusted to cause changes in the pinning sites in the magnetic shift registers 120 thereby allowing movement or pinning of the domain walls 110.

In exemplary embodiments, the domain walls 110 are shifted to distinct locations on the nanowire 105 by applying a time-dependent shift current to the nanowire 105. This shifting operation is implemented in order to read out the magnetization direction of magnetic domain segments 130 of the magnetic nanowire 105 that are separated by domain walls 110. The dynamic pinning methods described herein then pin the domain walls 110 to the distinct pinning sites after the shift current is applied.

Figure 2:
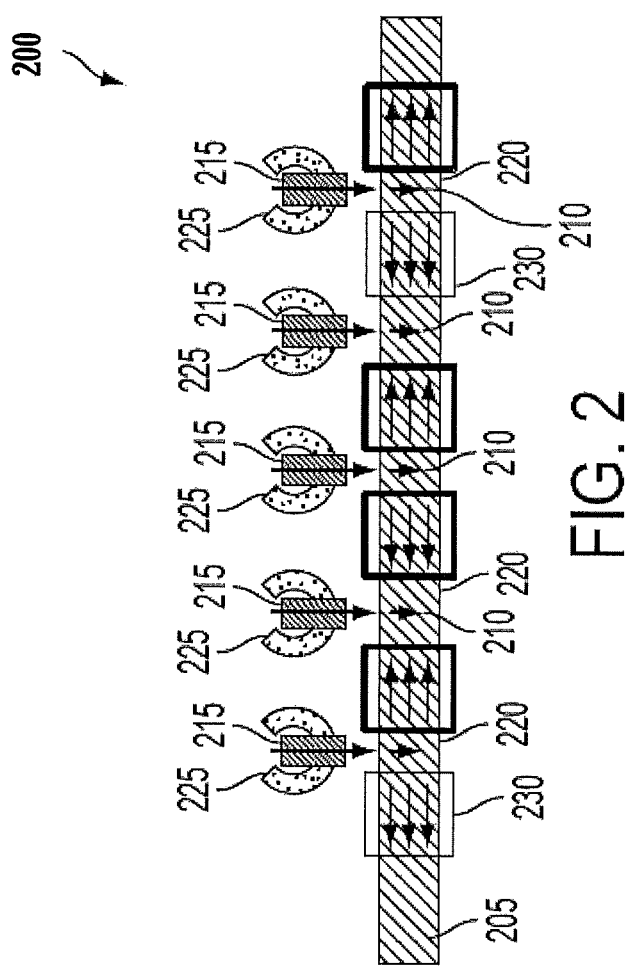
FIG. 2 illustrates a schematic diagram of another exemplary magnetic domain wall shift register memory device.

FIG. 2 illustrates a schematic diagram of another exemplary magnetic domain wall shift register memory device 200. In exemplary embodiments, the device 200 includes a nanowire 205 that supports distinct domain walls 210, which are shifted along the nanowire 205 as described herein. As described further herein, the device 200 supports both domain wall injection into the nanowire 205 and magnetization read-out of the domain walls 210 from the nanowire 205. The device 200 further includes a series of magnetized structures 215 (e.g., permanent magnets) arranged adjacent respective shift registers 220 disposed in the nanowire 205. The magnetized structures 215 have magnetic fields that induce pinning sites in the nearby magnetic shift registers 220. The magnetized structures 215 are each arranged within a control wire loop 225 that is disposed underneath, overhead or alongside the magnetized structures 215 and parallel to the nanowire 205. As described further herein, the control wire loops 225 support current that can be adjusted to cause changes in the pinning sites in the magnetic shift registers 220 thereby allowing movement or pinning of the domain walls 210.

In exemplary embodiments, the domain walls 210 are shifted to distinct locations on the nanowire 205 by applying a time-dependent shift current to the nanowire 205. This shifting operation is implemented in order to read out the magnetization direction of magnetic domain segments 230 of the magnetic nanowire 205 that are separated by domain walls 210. The dynamic pinning methods described herein then pin the domain walls 210 to the distinct pinning sites after the shift current is applied.

In exemplary embodiments, when no current is flowing through the control line 125 of FIG. 1 or the control wire loops 225 of FIG. 2, strong pinning from the magnetized pinning structures 115, 215 causes the domain walls 110, 210 to be pinned at specific locations on the magnetic nanowire 105, 205.

In exemplary embodiments, a short duration current pulse can applied to the control line 125 of FIG. 1 or the control wire loops 225 of FIG. 2, and the induced Oersted field counteracts some of the magnetic field created by the magnetized pinning structures 115, 215. This counteraction leads to a lower domain wall pinning energy than when no current is present in the control line 125 or the control wire loops 225. A reduced pinning energy reduces the current required to shift the domain walls 110, 210 in the magnetic domain wall shift register 120, 220. When the control line/control wire loop current returns to zero, strong pinning is re-established.

In exemplary embodiments, if a current pulse is applied to the control line 125 of FIG. 1 or the control wire loops 225 of FIG. 2, the induced Oersted field can flip the magnetization direction of the pinning structures in the magnetic shift registers 120, 220, leading to a lower domain wall pinning energy. A reduced pinning energy reduces the current required to shift the domain walls 110, 210 in the magnetic domain wall shift registers 120, 220. When a second current pulse of opposite polarity from the first is applied to the control line 125 or the control wire loops 225, the induced Oersted field can flip the magnetization direction of the pin-ning structures in the magnetic shift registers 120, 220 back to the original direction, re-establishing strong pinning.

In exemplary embodiments, if a current is applied to the control line 125 of FIG. 1 or the control wire loops 225 of FIG. 2, current-induced heating of the magnetic pinning structures in the magnetic shift registers 120, 220, can reduce the magnetic field created by the magnetized pinning structure, leading to a lower domain wall pinning energy. A reduced pinning energy reduces the current required to shift the domain walls 110, 210 in the magnetic domain wall shift register 120, 220. When the control line 125 or the control wire loops 225 current(s) return to zero, the magnetic pinning structure can cool, increasing the magnetic field of the pinning structure(s) and re-establishing strong pinning.

Figure 3:
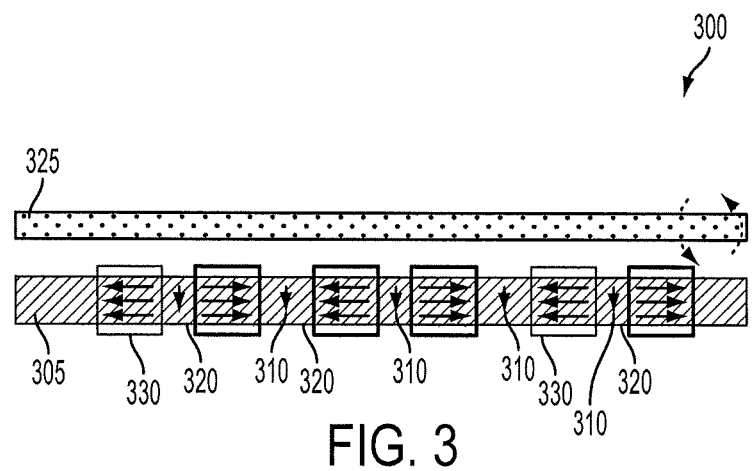
FIG. 3 illustrates a schematic diagram of another exemplary magnetic domain wall shift register memory device.

FIG. 3 illustrates a schematic diagram of another exemplary magnetic domain wall shift register memory device 300. In exemplary embodiments, the device 300 includes a nanowire 305 that supports distinct domain walls 310, which are shifted along the nanowire 305 as described herein. As described further herein, the device 300 supports both domain wall injection into the nanowire 305 and magnetization read-out of the domain walls 310 from the nanowire 305. The device 300 further includes a control line 325 that can produce a magnetic field that induces pinning sites in the nearby magnetic shift registers 320. The control line 325 is arranged parallel to the nanowire 305. The control line 325 may be a single or multiple independent or connected current-carrying lines or loops or other structures or any combination thereof. In addition, single or multiple independent or connected control lines may be oriented parallel to and/or perpendicular to and/or in any combination thereof with respect to the nanowire 305. As described further herein, the control line 325 supports current that can be adjusted to cause changes in the pinning sites in the magnetic shift registers 320 thereby allowing movement or pinning of the domain walls 310.

In exemplary embodiments, the domain walls 310 are shifted to distinct locations on the nanowire 305 by applying a time-dependent shift current to the nanowire 305. This shifting operation is implemented in order to read out the magnetization direction of magnetic domain segments 330 of the magnetic nanowire 305 that are separated by domain walls 310. The dynamic pinning methods described herein then pin the domain walls 310 to the distinct pinning sites after the shift current is applied.

In exemplary embodiments, when no current is flowing through the control line 325, strong pinning from normally-occurring imperfections or purposely-designed structural, compositional, crystalline, or magnetic variations in the magnetic nanowire 305 causes the domain walls 310 to be pinned in the magnetic nanowire 305.

In exemplary embodiments, when a current pulse is applied to the control line 325, the component of the induced Oersted field that is perpendicular to the magnetization of the domain walls 310 decreases the pinning strength by reducing the amount of effective magnetic anisotropy in the magnetic nanowire 305, which reduces the pinning energy. A reduced pinning energy reduces the current required to shift the domain walls 310 in the magnetic domain wall shift register 320. When the control line current returns to zero, strong pinning is re-established.

In exemplary embodiments, if the control line or control wire loop current pulse is synchronized with the shift current pulse in the magnetic nanowire 105, 205, 305, then the pin-ning can be reduced only when the domain walls 110, 210, 310 need to be shifted, yielding a highly controlled implementation for shifting domain walls using moderate shift-current magnitude that maintains strong static pinning for robust memory storage applications.

Figure 4:
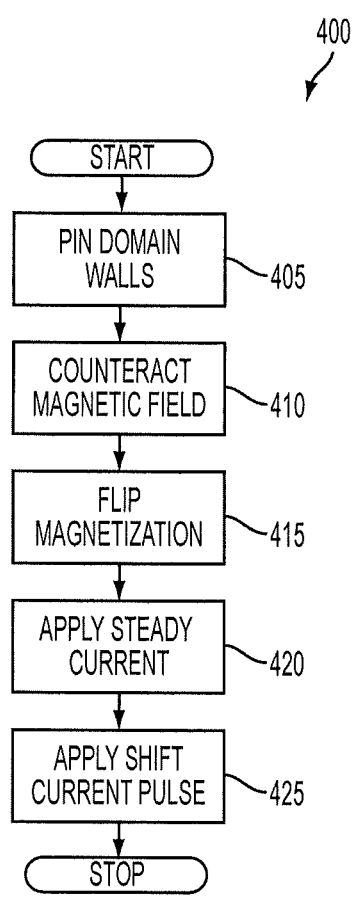
FIG. 4 illustrates a method of pinning magnetic domain walls in magnetic domain shift registers in accordance with exemplary embodiments.

FIG. 4 illustrates a method 400 of pinning magnetic domain walls in magnetic domain shift registers in accordance with exemplary embodiments. For illustrative purposes, the method 400 implements either of the devices 100, 200 of FIGS. 1 and 2 respectively. Furthermore, it will be appreciated that the different blocks of the method described herein can be implemented in any order depending on the type of operation being performed on the devices 100, 200. At block 405, the device 100, 200 pins the domain walls 110, 210. As described herein when no current is flowing through the control line 125 or the control wire loops 225, strong pinning from the magnetized pinning structures 115, 215 will cause the domain walls 110, 210 to be pinned at specific locations on the magnetic nanowire 105, 205.

At block 410, the device 100, 200 counteracts the magnetic field of the magnetized pinning devices 115, 215. For example, a short-duration current pulse is applied to the control line 125 or the control wire loops 225 and the induced Oersted field counteracts some of the magnetic field created by the magnetized pinning structure 115, 215, which leads to a lower domain wall pinning energy than when no current is present in the control line 125 or the control wire loops 225. A reduced pinning energy reduces the current required to shift the domain walls 110, 210 in the magnetic domain wall shift register 120, 220. When the control line or the control wire loop current returns to zero, strong pinning is re-established similar to block 405.

At block 415, the devices 100, 200 flip the magnetization direction of the magnetized pinning structures 115, 125. When a current pulse is applied to the control line 125 or the control wire loops 225, the induced Oersted field can flip the magnetization direction of the pinning structures 115, 215, leading to a lower domain wall pinning energy. A reduced pinning energy reduces the current required to shift the domain walls 110, 210 in the magnetic domain wall shift register 120, 220. When a second current pulse of opposite polarity from the first is applied to the control line 125 or the control wire loops 225, the induced Oersted field can flip the magnetization direction of the pinning structures 115, 215 back to the original direction, re-establishing strong pinning, similar to block 405.

At block 420, a steady current can be applied to the control line 125 or the control wire loops 225. When a current is applied to the control line 125 or the control wire loops 225, current-induced heating of the magnetic pinning structure 115, 215 can reduce the magnetic field created by the magnetized pinning structures 115, 215, leading to a lower domain wall pinning energy. A reduced pinning energy reduces the current required to shift the domain walls 110, 210 in the magnetic domain wall shift register 120, 220. When the control line or loop currents returns to zero, the magnetic pinning structures 115, 215 can cool, increasing the magnetic field of the pinning structures 115, 215 and re-establishing strong pinning, similar to block 405.

At block 425, a shift current pulse is applied to the device 100, 200. As described herein, the shift current pulse applied to the control line 125 or the control wire loops 225, the domain walls 110, 210 are shifted along the nanowire 105, 205. If the control line or loop current pulse is synchronized with the shift current pulse in the magnetic nanowire 105, 205, then the pinning can be reduced only when the domain walls need to be shifted, resulting in a highly controlled method for shifting the domain walls 110, 210 using moderate shift-current magnitude that maintains strong static pinning for robust memory storage applications.

Figure 5:
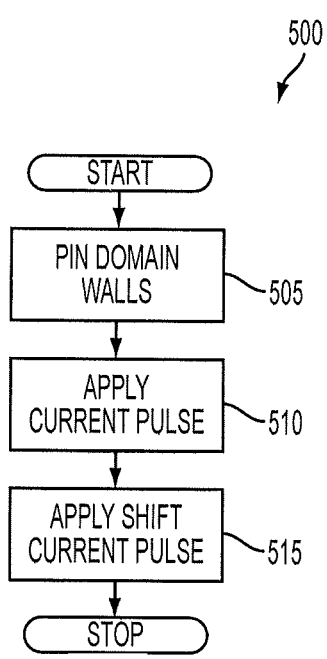
FIG. 5 illustrates a method of pinning magnetic domain walls in magnetic domain shift registers in accordance with exemplary embodiments.

FIG. 5 illustrates a method 500 of pinning magnetic domain walls in magnetic domain shift registers in accordance with exemplary embodiments. For illustrative purposes, the method 500 implements the device 300 of FIG. 3. Furthermore, it will be appreciated that the different blocks of the method 500 described herein can be implemented in any order depending on the type of operation being performed on the device 300. At block 505, the device 300 pins the domain walls 310. As described herein when no current is flowing through the control line 325, strong pinning from normally-occurring imperfections in the magnetic nanowire 305 will cause domain walls 310 to be pinned in the magnetic nanowire 305.

At block 510, a current pulse is applied to the device 300. When a current pulse is applied to the control line 325, the component of the induced Oersted field that is perpendicular to the magnetization of the domain wall 310 will decrease the pinning strength by reducing the amount of effective magnetic anisotropy in the magnetic nanowire 305, which reduces the pinning energy. A reduced pinning energy reduces the current required to shift the domain walls 310 in the magnetic domain wall shift register 320. When the control line current returns to zero, strong pinning is re-established similar to block 505.

At block 515, a shift current pulse is applied to the device 300. As described herein, the shift current pulse applied to the control line 325, the domain walls 310 are shifted along the nanowire 305. If the control line current pulse is synchronized with the shift current pulse in the magnetic nanowire 305, then the pinning can be reduced only when the domain walls need to be shifted, resulting in a highly controlled method for shifting the domain walls 310 using moderate shift-current magnitude that maintains strong static pinning for robust memory storage applications.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A magnetic domain wall shift register memory device, comprising:
   a nanowire;
   a plurality of pinning sites disposed along the nanowire;
   a control line arranged substantially parallel and non-collinear to the nanowire and configured to support a current; and
   a plurality of magnetized pinning structures disposed along the control line.

2. The device as claimed in claim 1 wherein each of the plurality of pinning sites are disposed adjacent a respective magnetized pinning structure of the plurality of magnetized pinning structures.

3. The device as claimed in claim 1 wherein each of the plurality of magnetized pinning structures is configured to generate a magnetic field at a respective pinning site of the plurality of pinning sites.

4. The device as claimed in claim 3 wherein the magnetic field from the control line weakens a pinning strength at the respective pinning site.

5. The device as claimed in claim 3 wherein the magnetic field from the control line switches an orientation of the respective pinning site.

6. The device as claimed in claim 3 wherein the current is a current pulse.

7. The device as claimed in claim 1 wherein each of the plurality of pinning sites pins a domain wall at a location along the nanowire.

8. The device as claimed in claim 1 one wherein each of the plurality of magnetized pinning structures increases a pinning strength at a respective pinning site of the plurality of pinning sites.

9. A magnetic domain wall shift register memory device, comprising:
   a nanowire;
   a plurality of pinning sites disposed along the nanowire;
   a plurality of control wire loops disposed substantially parallel and non-collinear to the nanowire and configured to support a current; and
   a plurality of magnetized pinning structures disposed in a respective control wire loop of the plurality of control wire loops.

10. The device as claimed in claim 9 wherein each of the plurality of pinning sites are disposed adjacent a respective magnetized pinning structure of the plurality of magnetized pinning structures.

11. The device as claimed in claim 9 wherein each of the plurality of magnetized pinning structures is configured to generate a magnetic field at a respective pinning site of the plurality of pinning sites.

12. The device as claimed in claim 11 wherein the magnetic field from a control wire loop weakens a pinning strength at the respective pinning site.

13. The device as claimed in claim 11 wherein the magnetic field from a control wire loop switches an orientation of the respective pinning site.

14. The device as claimed in claim 11 wherein the current is a current pulse.

15. The device as claimed in claim 9 wherein each of the plurality of pinning sites pins a domain wall at a location along the nanowire.

16. The device as claimed in claim 9 one wherein each of the plurality of magnetized pinning structures increases a pinning strength at a respective pinning site of the plurality of pinning sites.

* * * * *